(12) United States Patent
Rosenberg

(10) Patent No.: US 7,634,146 B2
(45) Date of Patent: Dec. 15, 2009

(54) METHODS AND APPARATUS FOR ENCODING AND DECODING VIDEO DATA

(75) Inventor: Aron Rosenberg, Berkeley, CA (US)

(73) Assignee: Logitech Europe S.A. (CH)

( * ) Notice: Subject to any disclaimer, the term of this patent is extended or adjusted under 35 U.S.C. 154(b) by 834 days.

(21) Appl. No.: 10/957,074

(22) Filed: Oct. 1, 2004

(65) Prior Publication Data

US 2005/0117806 A1    Jun. 2, 2005

Related U.S. Application Data

(60) Provisional application No. 60/512,667, filed on Oct. 20, 2003.

(51) Int. Cl.
*G06K 9/36* (2006.01)
*G06K 9/46* (2006.01)

(52) U.S. Cl. ........................... 382/245; 382/233

(58) Field of Classification Search ................. 382/232, 382/233, 236, 238, 245, 246
See application file for complete search history.

(56) References Cited

U.S. PATENT DOCUMENTS

| 3,017,456 A | 1/1962 | Schreiber |
| 4,813,056 A | 3/1989 | Fedele et al. |

(Continued)

FOREIGN PATENT DOCUMENTS

| EP | 0 763 944 A | 3/1997 |

(Continued)

OTHER PUBLICATIONS

Salomon, D., "Data Compression the Complete Reference, Passage" 1998, Data Compression: The Complete Reference, pp. 6-10, Springer, New York, NY USA, XP002315914 ISBN: 0-387-98280-9 the whole document.

(Continued)

*Primary Examiner*—Phuoc Tran
(74) *Attorney, Agent, or Firm*—Lando & Anastasi, LLP

(57) ABSTRACT

According to aspects of embodiments of the invention, a method of encoding a sequence of frames of image data, each frame including a number of lines of pixels equal to a frame height, and each line having a number of pixels equal to a line length, comprises: encoding as an encoded symbol stream a sequence of pixels of a frame without including an end-of-line code after each line; identifying as a run having a run length, a sequence of pixels having values less than a threshold; and encoding the run using digit encoding. According to other aspects, the digit encoding may further comprise: identifying a set of most frequently used symbols; assigning a symbolic digit to each of the set of most frequently used symbols; assigning a start symbol; and encoding using digit encoding may include inserting in the encoded symbol stream the start symbol; and inserting in the encoded symbol stream after the start symbol a sequence of symbolic digits identifying the run length of the run. The method may yet further comprise: assigning an end symbol; and inserting the end symbol in the encoded symbol stream after the sequence of symbolic digits. According to yet another variation, the method may further comprise: defining the assigned start symbol to include a field indicating how many of the symbolic digits are required to identify the run length of the run.

26 Claims, 7 Drawing Sheets

U.S. PATENT DOCUMENTS

| | | | |
|---|---|---|---|
| 5,497,434 A | * | 3/1996 | Wilson ...................... 382/232 |
| 5,528,284 A | | 6/1996 | Iwami et al. |
| 5,740,278 A | | 4/1998 | Berger et al. |

FOREIGN PATENT DOCUMENTS

| | | |
|---|---|---|
| EP | 0 933 948 A | 8/1999 |
| JP | 07 095571 A | 4/1995 |
| WO | WO 02/15589 A | 2/2002 |

OTHER PUBLICATIONS

Yamauchi, Y.: "Reliable multicast over the mobile packet radio channel" Vehicular Technology Conference, Orlando, FL USA, May 6-9, 1990, pp. 366-371, XP 010003594, IEEE, New York, USA p. 367-p. 368, paragraph 3.2, figure 3.

Steinbach E., et al.: "Standard Compatible Extension of H.263 for Robust Video Transmission on Mobile Environments" IEEE Transactions on Circuits and Systems for Video Technology, IEEE Inc. New York, US vol. 7, No. 6, Dec. 1997, pp. 872-881, XP000199011 ISSN: 1051-8215 p. 874-875, paragraph III.

* cited by examiner

METHODS AND APPARATUS FOR ENCODING AND DECODING VIDEO DATA

RELATED APPLICATION

This application claims priority under 35 U.S.C. § 119(e) to U.S. Provisional Application Ser. No. 60/512,667, entitled "METHOD AND APPARATUS FOR COMMUNICATING DATA BETWEEN TWO HOSTS," by Aron Rosenberg and Jeffrey Wilson, filed on Oct. 20, 2003, which is herein incorporated by reference in its entirety.

BACKGROUND OF THE INVENTION

The invention relates generally to encoding and decoding of video information, especially such a used for the transmission of video information, and more particularly to systems and methods for video conferencing.

There are many systems and techniques for transmitting video information. The most effective conventional techniques involve special transmission and reception systems and require dedicated communication links to encode, transmit, receive and decode video information. The encoding, transmission, and decoding operations are generally resource intensive in terms of the processing (e.g., memory, CPU speed) and transmission requirements (e.g., communication link bandwidth) necessary to provide an adequate video presentation. Such special systems also are generally expensive to own and operate and therefore are not available to an average consumer.

Conventional methods for sending video data are shown and described in U.S. Pat. No. 5,740,278, entitled FACSIMILE-BASED VIDEO COMPRESSION METHOD AND SYSTEM, and U.S. Pat. No. 5,973,626, entitled BYTE-BASED PREFIX ENCODING, each of which are incorporated by reference herein by their entirety and form a part of this specification.

As discussed in U.S. Pat. No. 5,740,278, and in other conventional systems such as MPEG, video data is encoded in either what is referred to herein as "intra" frames (key frames) that hold a single frame image (which only refers to itself) or "inter" frames (delta or difference frames) that refer to another frame (either an intra frame or another inter frame). There are problems with such methods in that:

(1) network traffic associated with transmission of the two different types of frames is bursty, sometimes requiring a high available bandwidth and other times requiring only a lower available bandwidth due to the extraordinary amount of data transmitted in intra frames vs. inter frames (data in intra frames represents an entire image and are generally larger than inter frames which include more repetitive data and therefore can be compressed more easily, i.e. data rate and required bandwidth vary widely);

(2) loss of a single intra frame causes loss of quality, and inter frames subsequent to such a loss have no meaning, as they are only meaningful in reference to an intra frame to which they refer or another inter frame (which can also be lost) to which they refer;

(3) if an intra frame is lost, recovery is very inefficient because the encoder must transmit a new intra frame to regain synchronization, as the entire frame needs to be transmitted, even to replace only a lost portion of the frame; and (4) the encoding technique produces an image which is initially very good (intra frame), but the quality of the image slowly degrades over time until transmission of next intra frame.

In conventional fax-based video encoding, first a difference frame is generated representing the difference in intensity of each pixel location in two succeeding image frames. On a line-by-line basis, the difference values are encoded. In order to prevent loss of image data or loss of image synchronization (that is, where each line starts and ends), each line of the transmitted video signal has an end-of-line code appended to the end of each line. In the case of conventional fax systems, this end-of-line code is used to protect against bit errors. Consequently, the end-of-line code is large in order to provide sufficient redundancy to correct random bit errors to the degree desired.

With the advent of public networks such as the Internet, many commercial products are available to the average consumer for transmitting video information over public networks. These systems may be, for example, coupled with a personal computer for use over the Internet or other public or private communication network. For example, a video conferencing or video distribution system may be configured to transmit video information over the Internet among a group of PCs. Due to the intense resource requirements necessary for transmitting such information, and the limited and/or unreliable resources available on public networks, however, performance of such systems falls short of expectations, and such systems are rendered less usable than more expensive specialized systems. What is needed, therefore, are improved methods for communicating video information.

SUMMARY OF THE INVENTION

According to various aspects of the present invention, video data is transmitted using various improved encoding and data transfer techniques. According to various aspects of the present invention, improved coding methods are provided that improve the conventional systems disclosed in U.S. Pat. No. 5,740,278. It should be appreciated that various aspects of the present invention may be used with other video transmission systems, also, and the present invention is not limited to the systems disclosed in U.S. Pat. No. 5,740,278.

In one aspect of the present invention, a method is provided for improving a fax-based encoding for transmitting video data that reduces the amount of data required to be transmitted. According to this aspect of the invention, fax-based difference frame data is transmitted over a communication network in which data integrity is maintained or checked by various layers of the communication network. It is appreciated that such data integrity checks are performed independently of the application transmitting the data, and, according to one embodiment of the present invention, the end-of-line code information is simply omitted. According to another embodiment, data is otherwise encoded conventionally. That is, data above a threshold is encoded by value, and data below or equal to the threshold is encoded by a special symbol indicating the length of such a "run" below the threshold.

By eliminating the end-of-line code, longer runs of data below the threshold may appear in the data stream (e.g., runs that go from one line to the next line or series of lines). To accommodate longer runs, however, a high data rate (and, therefore, a high transmission bandwidth required), may result due to an increase in the number of possible special symbols used to represent such runs. For example, when using Huffman encoding, an increase in the number of data symbols increases the required bandwidth. In particular, Huffman encoding assigns a unique bit string to each symbol, and the most frequently occurring symbols are assigned the shortest bit strings. Thus, if the symbol space is too large, some symbols will be represented by long bit strings, rendering Huffman encoding inefficient.

In one aspect of the present invention, a digit-based encoding method is provided wherein long runs are encoded using the most common symbols in use. In one embodiment, a plurality of symbols are chosen, each of which represents a frequently-occurring symbol. In one embodiment, the ten most frequently-occurring symbols are chosen and each one designated and assigned as a symbolic decimal digit having values 0-9. In one embodiment, a special symbol is defined that indicates the beginning of a sequence. In another embodiment, another symbol may be used to delineate an end of the sequence, although in one embodiment, the same symbol may be used. Although this aspect is disclosed using a decimal symbolic digit set, other numeric bases, such as octal or hexadecimal, having eight or sixteen symbolic digits respectively, may be used.

According to another aspect of the present invention, a method of encoding includes both intra and inter data within a single encoded frame. According to one embodiment, new symbols are introduced to delineate coded intra and inter data in a single frame. Because actual image data is encoded and transmitted over a number of frames, the burstiness of the resulting network data rate for transmitting the data is reduced. Further, the peak bandwidth that is required to transmit the data is reduced. Therefore, "real" image data can be dispersed over many messages relating to a frame, and thus the implications of losing a single frame (e.g., the intra frame) is also reduced, as the risk of losing real data is dispersed over many messages. With the loss of a single message, only a portion of the video signal experiences any degradation.

In another embodiment of the invention, a feedback mechanism may be used to allow a receiver to recover a portion of signal that was lost without having to resend an intra frame (e.g., the entire image). In one embodiment, feedback may be used that allows the receiver to identify to a sender of the video image which area(s) of the image include degradation due to message loss, and in response, the sender can send only the portion of the image affected by the message loss. For example the sender can send missing lines 10 through 20 that were affected by message loss. On the next outgoing frame, the sender can instruct the encoder to intra-encode lines 10-20 and inter-encode the remaining portion of the signal.

The intra frame data may, according to one embodiment of the invention, be dispersed over a number of frames containing inter frame data. For example, for a video signal transmitted at 30 fps, the entire video frame can be refreshed over a period of transmission of 300 frames (that is, each frame of intra frame data can be dispersed over the 300 frames at a rate of 1/10 of a frame per inter frame transmitted).

In another aspect of the invention, a method for encoding data is provided that uses a temporal reference that can be used by a receiver to decode data. In one embodiment, a new type of frame is provided for transmitting video data. Conventionally, intra frames (key) and inter frames (difference) frames may be used for transmitting data as described above. In the case where two-way communication between a sender and receiver is possible, however, a new frame may be used, referred to hereinafter variously as an anchor frame or a "T" frame.

In one embodiment of the invention, an anchor frame defining a video image is transmitted from a sender to a receiver and stored in a memory of the receiver. The anchor frame serves as a temporal reference to which other image data (e.g., difference data) may be referenced. For instance, the first frame (e.g., an intra frame) of a data transmission may be considered an anchor frame, and the receiver may request a new anchor frame periodically (e.g., every 5 seconds). Subsequent anchor frames may be inter frames or intra frames, as circumstances arise. Thereafter, the sender may be configured to encode and send difference frames, each of which is independently related to the most recent established anchor frame (rather than conventional difference frames which are relative to the previous inter frame or intra frame). In this manner, difference data may be sent that are unrelated to any previous difference frames, and therefore, the video signal does not degrade with the loss of one or more difference frames, as successive difference frames are not dependent upon the integrity of all the proceeding difference frames. Such an encoding method is beneficial in environments where messages may be lost, damaged or degraded.

The encoder, to properly encode the signal and have the decoder recover the encoded signal, must obtain information a priori identifying which anchor frame the decoder has most recently received and stored. To this end, a sender may communicate to a receiver that a particular frame should be designated as an anchor frame. Further, the receiver communicates to the sender that the anchor frame was successfully received and the received anchor frame may be thereafter used as a reference for coding difference data. The sender may transmit data normally in this mode, or may switch to this transmission mode from a conventional intra/inter frame encoding mode. In one embodiment, a traditional intra/inter frame encoding method may be used, and a special symbol or other indication may be sent from the sender to the receiver to transfer into an anchor frame encoding mode.

In another aspect of the present invention, the quality of the connection is monitored. In one embodiment, packet and frame loss is observed, and the quality of the video signal is adjusted accordingly. For instance, with no frame loss and low delay, the connection is determined to be a good connection, and therefore the quality of the video signal and frame rate may be raised. Additionally the rate of requesting T frames may change in response to connection quality.

According to one aspect of the invention, a method of encoding a sequence of frames of image data, each frame including a number of lines of pixels equal to a frame height, and each line having a number of pixels equal to a line length. The method comprises acts of encoding, as an encoded symbol stream, a sequence of pixels of a frame without including an end-of-line code after each line, identifying, as a run having a run length, a sequence of pixels having values less than a threshold, and encoding the run using digit encoding. According to one embodiment, digit encoding further comprises acts of identifying a set of most frequently used symbols, assigning a symbolic digit to each of the set of most frequently used symbols, assigning a start symbol, and encoding using digit encoding includes acts of inserting in the encoded symbol stream the start symbol, and inserting in the encoded symbol stream after the start symbol a sequence of symbolic digits identifying the run length of the run. According to another embodiment, the method further comprises acts of assigning an end symbol, and inserting the end symbol in the encoded symbol stream after the sequence of symbolic digits. According to another embodiment, the method further comprises an act of defining the assigned start symbol to include a field indicating how many of the symbolic digits are required to identify the run length of the run.

According to one aspect of the invention, an apparatus for encoding a sequence of frames of image data is provided comprising a host executing a sequence of instructions including encoding as an encoded symbol stream a sequence of pixels of a frame without including an end-of-line code after each line, identifying as a run having a run length, a sequence of pixels having values less than a threshold, and encoding the run using digit encoding. According to one embodiment, the sequence of instructions further comprises identifying a set of most frequently used symbols, assigning a symbolic digit to each of the set of most frequently used symbols, assigning a start symbol, and encoding using digit encoding includes inserting in the encoded symbol stream the start symbol, and inserting in the encoded symbol stream after the start symbol a sequence of symbolic digits identifying the run length of the run. According to another embodiment, the sequence of instructions further comprises assigning an end symbol, and inserting the end symbol in the encoded symbol stream after the sequence of symbolic digits. According to another embodiment, the sequence of instructions further comprises defining the assigned start symbol to include a field indicating how many of the symbolic digits are required to identify the run length of the run.

According to one aspect of the invention, a method is provided for decoding a run length of a run in a sequence of frames of image data. The method comprises acts of receiving a signal representing a symbol stream, identifying in the symbol stream a sequence defining the run length encoded as a sequence of digits, each digit represented by a symbol, and decoding the run length as a number represented by the sequence of digits. According to one embodiment, the act of identifying further comprises an act of recognizing in the symbol stream a symbol identifying a start of a sequence of digits. According to another embodiment, the act of identifying further comprises an act of recognizing in the symbol stream a symbol identifying an end of the sequence of digits. According to another embodiment, the act of recognizing further comprises an act of decoding the symbol identifying the start to determine a number of digit symbols which follow.

According to one aspect of the invention, an apparatus for decoding a run length of a run in a sequence of frames of image data is provided comprising a host executing a sequence of instructions including receiving a signal representing a symbol stream, identifying in the symbol stream a sequence defining the run length encoded as a sequence of digits, each digit represented by a symbol, and decoding the run length as a number represented by the sequence of digits. According to another embodiment, identifying further comprises recognizing in the symbol stream a symbol identifying a start of a sequence of digits. According to another embodiment, identifying further comprises recognizing in the symbol stream a symbol identifying an end of the sequence of digits. According to another embodiment, recognizing further comprises decoding the symbol identifying the start to determine a number of digit symbols which follow.

According to one aspect of the invention, a system for communicating a sequence of frames of image data from a first host to a second host is provided comprising a first host executing a sequence of instructions including a host executing a sequence of instructions including encoding as an encoded symbol stream a sequence of pixels of a frame without including an end-of-line code after each line, identifying as a run having a run length, a sequence of pixels having values less than a threshold, and encoding the run using digit encoding, a second host executing a sequence of instructions including receiving a signal representing a symbol stream, identifying in the symbol stream a sequence defining the run length encoded as a sequence of digits, each digit represented by a symbol, and decoding the run length as a number represented by the sequence of digits. According to one embodiment, the sequence of instructions further comprises identifying a set of most frequently used symbols, assigning a symbolic digit to each of the set of most frequently used symbols, assigning a start symbol, and encoding using digit encoding includes inserting in the encoded symbol stream the start symbol, and inserting in the encoded symbol stream after the start symbol a sequence of symbolic digits identifying the run length of the run.

According to one embodiment, identifying further comprises recognizing in the symbol stream a symbol identifying a start of a sequence of digits. According to another embodiment, the sequence of instructions further comprises assigning an end symbol, and inserting the end symbol in the encoded symbol stream after the sequence of symbolic digits. According to another embodiment, identifying further comprises recognizing in the symbol stream a symbol identifying an end of the sequence of digits. According to another embodiment, the sequence of instructions further comprises defining the assigned start symbol to include a field indicating how many of the symbolic digits are required to identify the run length of the run. According to another embodiment, recognizing further comprises decoding the symbol identifying the start to determine a number of digit symbols which follow.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
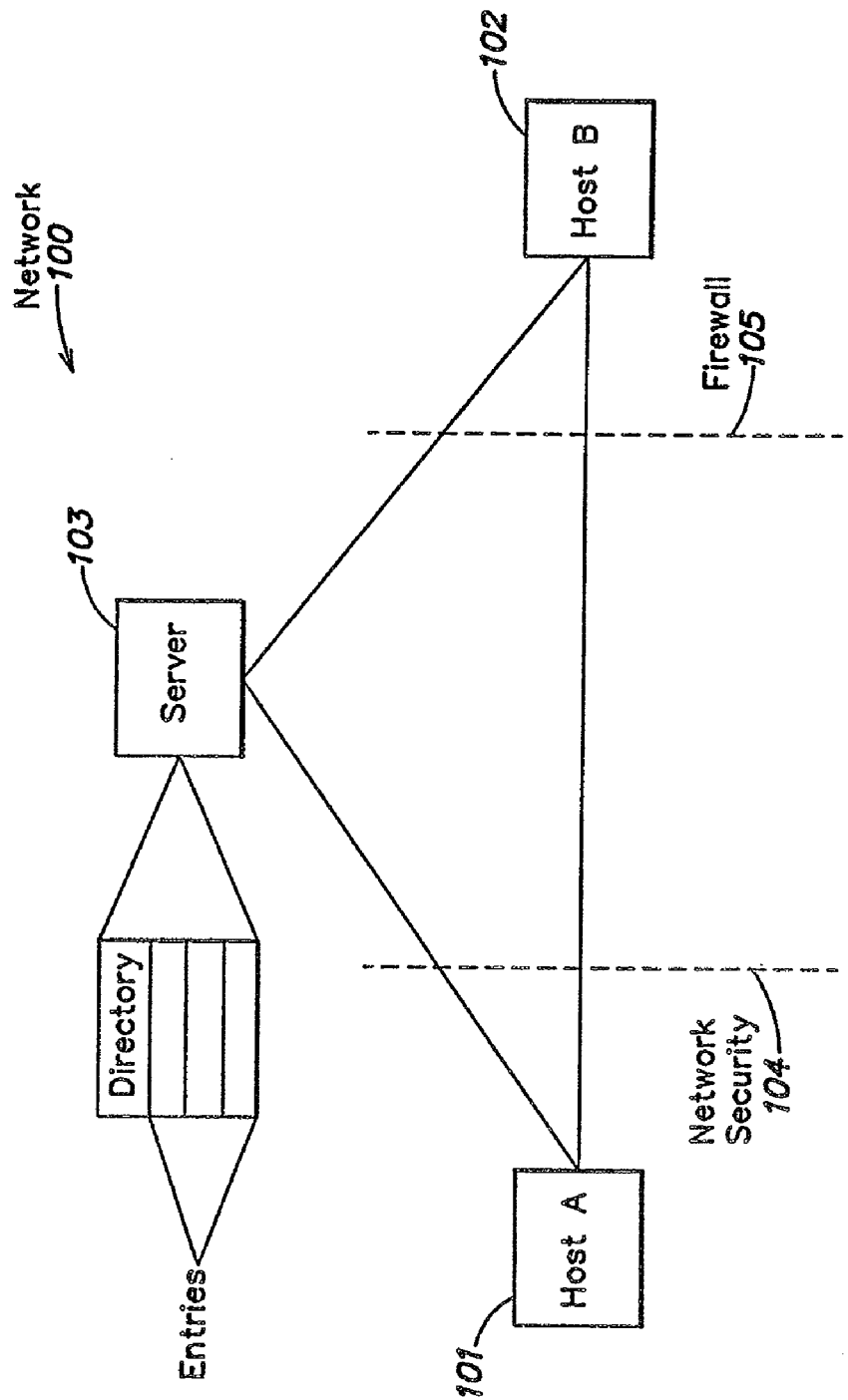
FIG. 1 is a schematic block diagram of a communication environment in which the present invention may be practiced.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

Various aspects of the present invention may be implemented on a communications network as is known in the art (e.g., the communications network 100 as shown in FIG. 1). Information may be transmitted between two hosts 101-102 coupled by one or more communications networks. For instance, hosts 101-102 may be coupled by one or more networks such as, for example, one or more secure networks (e.g., an enterprise network located beyond a network security system 104) and one or more unsecure networks, such as the Internet. Any number of networks, secure or unsecure, may be used to transmit data between hosts, and the invention is not limited to any particular configuration. For example, at least one of the hosts 102 may be located beyond a firewall 105 or other network security device.

In one embodiment, these hosts 101-102 may be general-purpose computer systems (e.g., personal computers) as is known in the art. These hosts may communicate using a communication protocol such as IP/UDP, and in one embodiment, video information is transmitted using IP/UDP packets. Various aspects of the present invention may be implemented using any type of computer system (e.g., PDA, cellphone, set-top box, or other computing device) or communication protocol (e.g., TCP), and the invention is not limited to any particular computer system or protocol.

For instance, information relating to the video transmission may be multiplexed into a channel carrying packets that are part of various message streams. Encoding of the multiplexed channel may include using a fixed length header in each packet. For example, the packet may contain media-specific field lengths. More particularly, 19 bits may be allocated to designate length of video, allowing for $2^{19}$ bytes of information per frame for video. Audio may be allocated, for example, 14 bits, and control may be allocated 13 bits. However, it should be appreciated that any number of digits may be used to encode any type of information (e.g., video, audio, text, control, etc.) and the invention is not limited to any particular number of digits.

In another example, the length information in the header may be used to define how the data layout appears within the packet. So, in one specific example, if there is video data, the video data is placed first in the packet, if there is audio, the audio is placed directly after the video information in the packet, etc. If there is audio data and no video data, then audio data may be placed first in the packet. If there is any other data, the data may be inserted after the header. In one example, a zero length indication means that the packet does not contain other data.

In an alternative example, audio data may be placed first, followed by control data, and then video data. This order may be beneficial, as it is appreciated that later packets are more likely to be dropped, and therefore, by including audio data nearer to the front of the packet, there is a better likelihood of receiving the audio information (e.g., in the first few packets), and therefore, it is more likely that the audio data is more likely to be received.

Various aspects of the present invention relate to improved coding methods for communicating data between hosts 101 and 102, for example. In one embodiment, host A (101) includes an encoder that is adapted to transmit video data to be decoded by a decoder at host B (102). Such an encoder and decoder may be adapted to perform improved encoding and decoding methods, respectively, as discussed herein.

Various embodiments of the present invention may be implemented on one or more computer systems. These computer systems may be, for example, general-purpose computers such as those based on Intel PENTIUM-type processor, Motorola PowerPC, Sun UltraSPARC, Hewlett-Packard PA-RISC processors, or any other type of processor. It should be appreciated that one or more of any type computer system may serve as host A, host B or other parts or sub-parts of the system according to various embodiments of the invention. Further, each host or other part of the system may be located on a single computer or may be distributed among a plurality of computers attached by a communications network.

A general-purpose computer system according to one embodiment of the invention is configured to perform any of the described communication functions, including but not limited to, encoding and decoding data. It should be appreciated that the system may perform other functions, including performing network communication functions, and the invention is not limited to a system having any particular function or set of functions.

Figure 2:
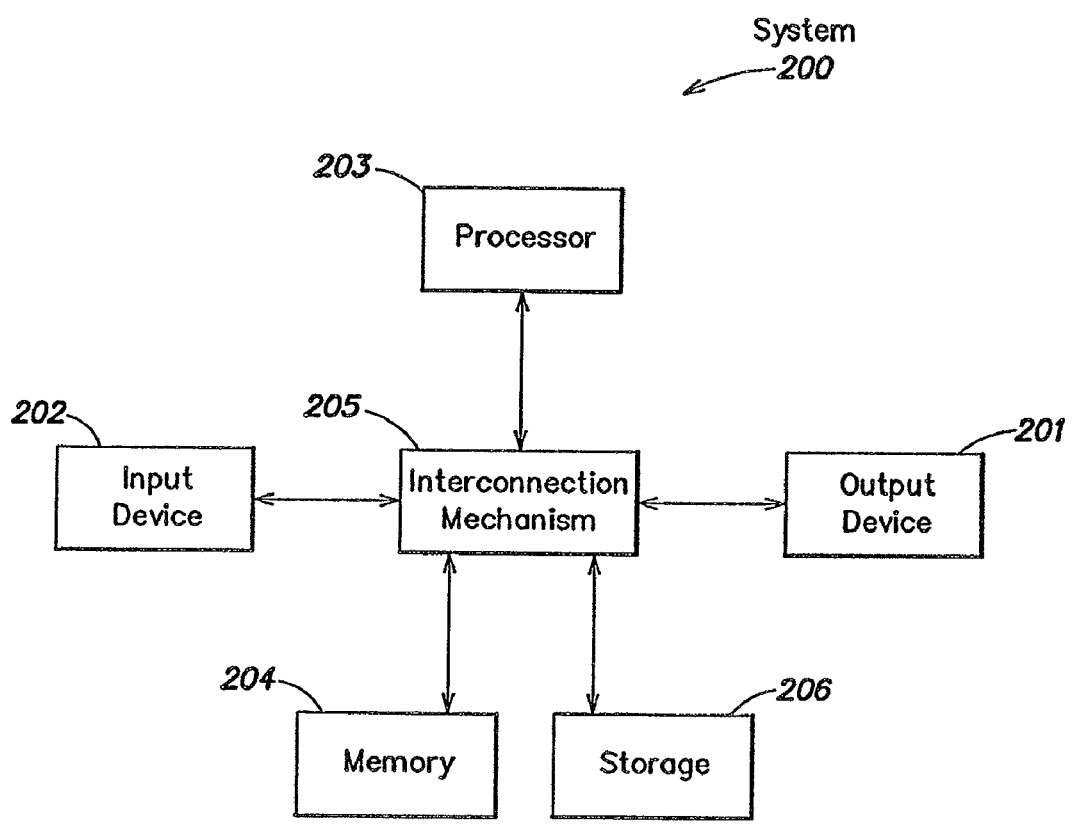
FIG. 2 is a schematic block diagram of a computing system on which aspects of the embodiments of the invention may be practiced.

For example, various aspects of the invention may be implemented as specialized software executing in a general-purpose computer system 200 such as that shown in FIG. 2. Computer system 200 may include a processor 203 connected to one or more memory devices 204, such as a disk drive, memory, or other device for storing data. Memory 204 is typically used for storing programs and data during operation of the computer system 200. Components of computer system 200 may be coupled by an interconnection mechanism 205, which may include one or more connections (e.g., busses coupling components integrated within a same machine) and/or a network (e.g., a network coupling components that reside on separate discrete machines). The interconnection mechanism 205 enables communications (e.g., data, instructions) to be exchanged between system components of system 200.

Computer system 200 may include one or more input devices 202, for example, a keyboard, mouse, trackball, microphone, touch screen, and one or more output devices 201, for example, a printing device, display screen, and/or speaker. In addition, computer system 200 may contain one or more interfaces (not shown) that connect computer system 200 to a communication network (e.g., in addition or as an alternative to the interconnection mechanism 205).

Figure 3:
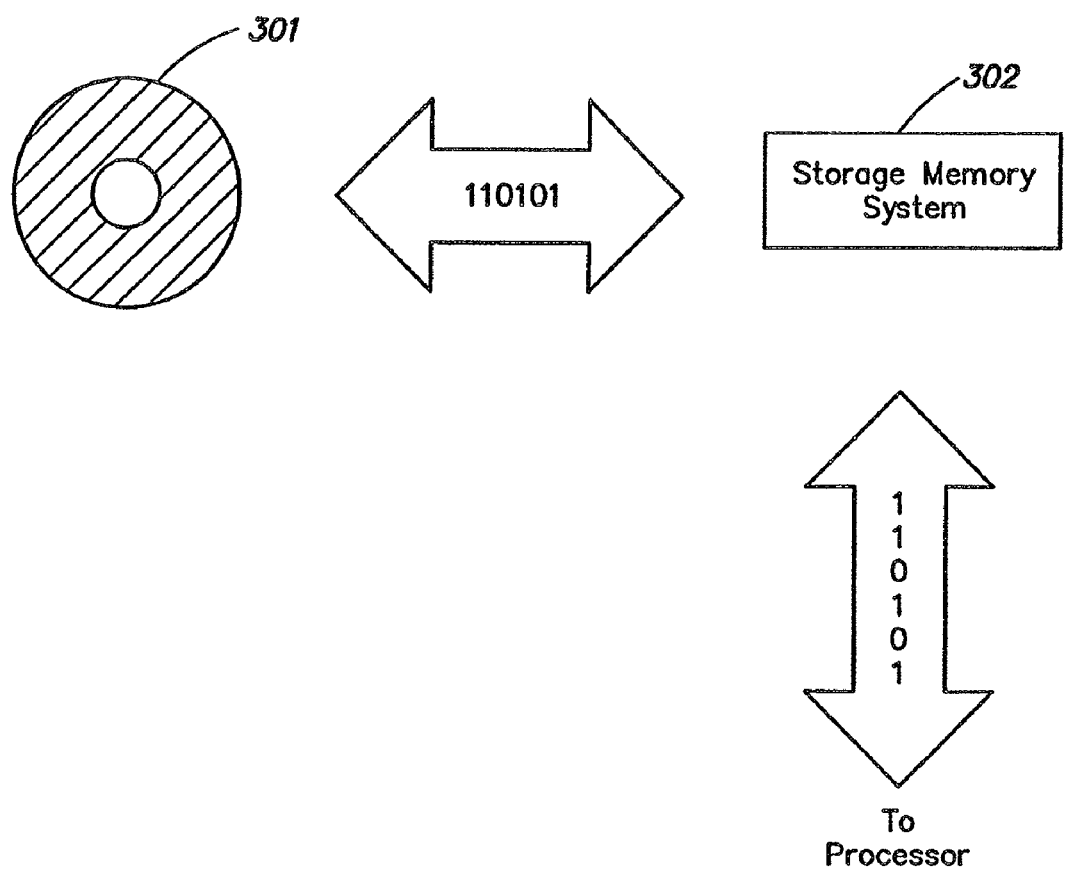
FIG. 3 is a schematic block diagram of the storage system of the computing system of FIG. 2.

The storage system 206, shown in greater detail in FIG. 3, typically includes a computer readable and writeable nonvolatile recording medium 301 in which signals are stored that define a program to be executed by the processor or information stored on or in the medium 301 to be processed by the program. The medium may, for example, be a magnetic or optical disk, or may be a solid state memory such as a flash EPROM as known in the art.

Typically, in operation, the processor causes data to be read from the nonvolatile recording medium 301 into another memory 302 that allows for faster access to the information by the processor than does the medium 301. Memory 302 is typically a volatile, random access memory such as a dynamic random access memory (DRAM) or static memory (SRAM). Memory 302 may be located in storage system 206, as shown, or in memory system 204, not shown. Processor 203 generally manipulates the data within the integrated circuit memory 204, 302 and then copies the data to the medium 301 after processing is completed. A variety of mechanisms are known for managing data movement between medium 301 and integrated circuit memory element 204, 302, and the invention is not limited to any particular mechanism for managing data movement. The invention is not limited to a particular memory system 204 or storage system 206.

The computer system may include specially-programmed, special-purpose hardware, for example, an application-specific integrated circuit (ASIC). Aspects of the invention may be implemented in software, hardware or firmware, or any combination thereof. Further, such methods, acts, systems, system elements and components thereof may be implemented as part of the computer system described above or as an independent component.

Although computer system 200 is shown by way of example as one type of computer system upon which various aspects of the invention may be practiced, it should be appreciated that aspects of the invention are not limited to being implemented on the computer system as shown in FIG. 2. Various aspects of the invention may be practiced on one or more computers having a different architecture or having components other than those shown in FIG. 2.

Computer system 200 may be a general-purpose computer system that is programmable using a high-level computer programming language. Computer system 200 may be also implemented using specially programmed, special purpose hardware. In computer system 200, processor 203 is typically a commercially available processor such as the well-known Pentium class processor available from the Intel Corporation. Many other processors are available. Such a processor usually executes an operating system which may be, for example, the Windows 95, Windows 98, Windows NT, Windows 2000 (Windows ME) or Windows XP operating systems available from the Microsoft Corporation, MAC OS System X operating system available from Apple Computer, the Solaris operating system available from Sun Microsystems, or UNIX operating systems available from various sources. Many other operating systems may be used.

The processor and operating system together define a computer platform for which application programs in high-level programming languages are written. It should be understood that the invention is not limited to a particular computer system platform, processor, operating system, or network. Also, it should be apparent to those skilled in the art that the present invention is not limited to a specific programming language or computer system. Further, it should be appreciated that other appropriate programming languages and other appropriate computer systems could also be used.

One or more portions of the computer system may be distributed across one or more computer systems coupled to a communications network. These computer systems also may be general-purpose computer systems. For example, various aspects of the invention may be distributed among one or more computer systems configured to provide a service (e.g., servers) to one or more client computers, or to perform an overall task as part of a distributed system. For example, various aspects of the invention may be performed on a client-server or multi-tier system that includes components distributed among one or more server systems that perform various functions according to various embodiments of the invention. These components may be executable, intermediate (e.g., IL) or interpreted (e.g., Java) code which communicate over a communication network (e.g., the Internet) using a communication protocol (e.g., TCP/IP).

It should be appreciated that the invention is not limited to executing on any particular system or group of systems. Also, it should be appreciated that the invention is not limited to any particular distributed architecture, network, or communication protocol.

Various embodiments of the present invention may be programmed using an object-oriented programming language, such as SmallTalk, Java, C++, Ada, or C# (C-Sharp). Other object-oriented programming languages may also be used. Alternatively, functional, scripting, and/or logical programming languages may be used. Various aspects of the invention may be implemented in a non-programmed environment (e.g., documents created in HTML, XML or other format that, when viewed in a window of a browser program, render aspects of a graphical-user interface (GUI) or perform other functions). Various aspects of the invention may be implemented as programmed or non-programmed elements, or any combination thereof.

As discussed, various aspects of the present invention relate to coding techniques that can be used to encode and decode video and related information. Described below are improved coding methods that may be used according to various aspects of the present invention. These methods may be used alone or in combination with these and other encoding methods.

Fax-Based Encoding

Figure 4:
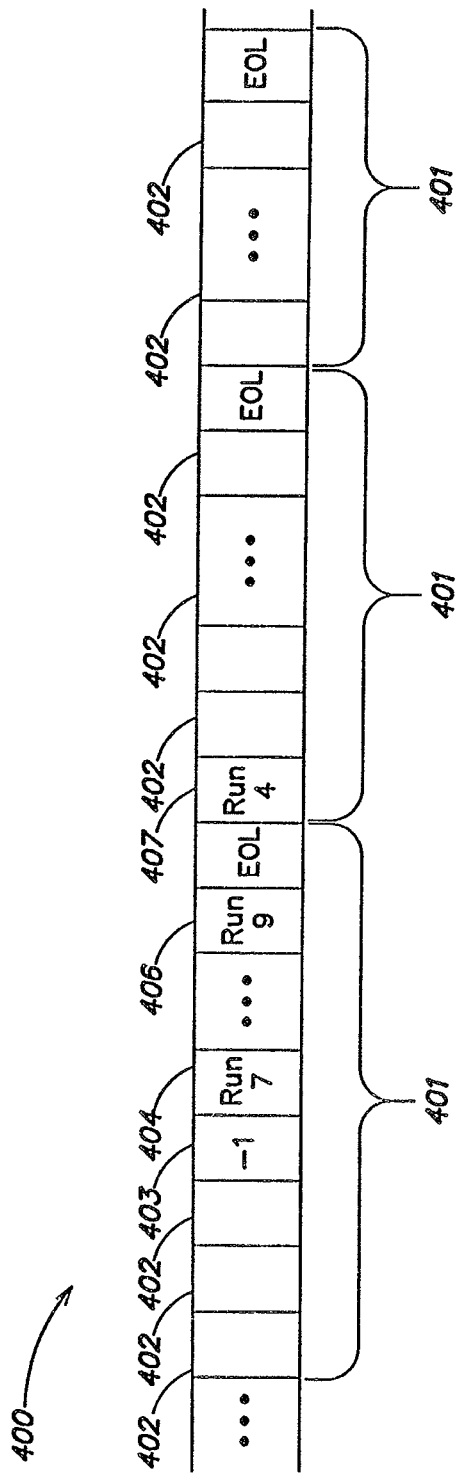
FIG. 4 is a byte stream map of a fax encoded image including end-of-line marks.

The byte stream map of FIG. 4 shows a fragment of a fax encoded image 400 including end-of-line marks, as conventionally performed. Each line 401 is encoded as a sequence of values 402 representative of one or more characteristics of each pixel of the line, in accordance with the encoding system used. For example, each value may represent the intensity of one or more pixels. In an encoding system in which difference frames are used, each value may represent the difference between the intensity of a pixel of the current frame and the intensity of the same pixel in a previous frame. Color pixels may be represented by triplets of values representing red, green and blue intensities, or other representations may be employed.

According to one embodiment of the present invention, a threshold may be selected that represents a difference value below which or equal to a value whose effect on the perceived image is negligible. The threshold may be predetermined, the threshold may be computed predictively during image processing, or the threshold may be computed using any other suitable technique. When difference frames are used, sequences of differences equal to or less than the threshold, referred to as runs, are common because the changes from one frame to the next are often small and occur slowly over a number of frames. Therefore, conventional encoding methods encode differences greater than the threshold directly 403, however, they encode runs having commonly occurring lengths as special short symbols 404 in the data stream indicative of a run having a certain length. Because runs are quite common when difference frames are used, encoding runs using symbols representing common run lengths inherently lowers the bandwidth required to encode the information.

Figure 5:
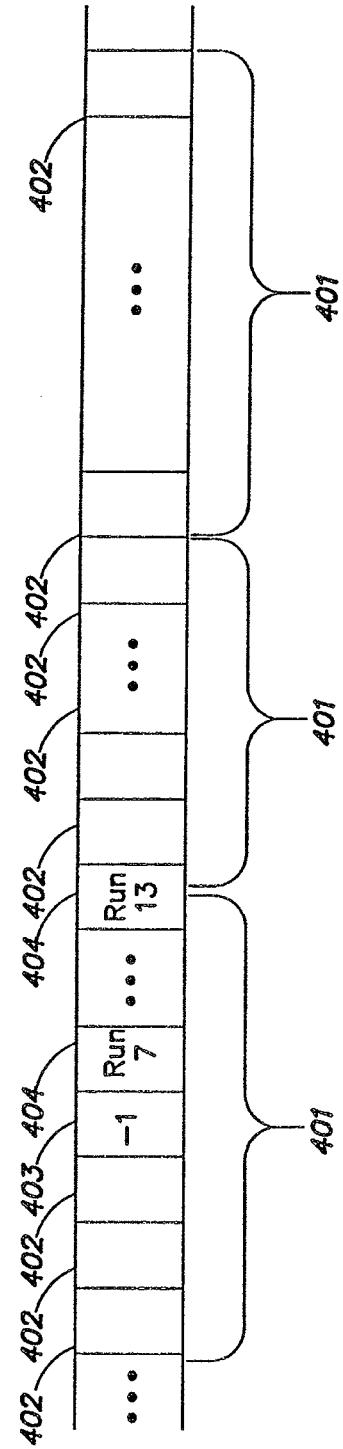
FIG. 5 is a byte stream map of a fax encoded image omitting end-of-line marks in accordance with one embodiment of the present invention.

FIG. 5 shows a byte stream map of a fax coded image according to one embodiment of the present invention. As shown in the byte stream map of FIG. 5, end-of-line (EOL) characters can be omitted from the data in embodiments of the invention where bit errors in the data are prevented or corrected by some alternate means, with the immediate benefit of reducing the bandwidth required to encode a frame by that taken up by the EOL characters. Another consequence of omitting EOL characters is that runs less than the threshold can span the boundary between lines, as shown. Comparing FIG. 5, 501 with FIG. 4, 406 and 407, it is observed that the decoder must keep track of how many decoded pixels are displayed on each line, and must end each line and begin the next line at an appropriate point in a continuous data stream.

Omission of the EOL character can be applied to any general fax based image communication system, but is particularly useful in systems where bit errors either do not occur, are compensated for by some other means or are not particularly harmful even if left uncorrected. The conventional EOL code of fax based encoders is unusually large and robust against bit errors because, in analog fax systems such as conventional fax via the plain old (analog) telephone system (POTS), there is no other protection against bit errors due to noise on the line. Thus, the EOL character is conventionally included to avoid having lines of a transmitted image getting out of synchronization with the edge of the page. Because systems embodying aspects of the present invention apply facsimile techniques in a system with a network protocol that guarantees that transmitted data is bit-error free (such as UDP or TCP), according to one aspect of the present invention, it is appreciated that the EOL character can be omitted, improving bandwidth utilization.

Because runs spanning the boundary between lines are possible when EOL characters are omitted, longer runs are also possible. Indeed, a greater number of possible run lengths are possible as run lengths longer than a single line are added to the possible run lengths less than or equal to the length of a single line. A run length comprising an entire frame is possible, for example using difference frames where there is substantially no change from the reference frame to the current frame. Assuming nothing further, a symbol set comprising symbols representing run lengths from one pixel to the number of pixels in a frame is required. The size of the symbol set and the bandwidth required to convey information using such a symbol set are substantial. Indeed, an encoding scheme in which runs are permitted to span frames could be devised, in which case an even larger symbol set could be required. To use bandwidth more efficiently, while allowing long run lengths, a new digit encoding method according to one embodiment of the present invention may be employed.

After dropping the EOL character, runs can span from one line to the next line. When using difference frame video, entire sections of the image may be represented by values below threshold which translates to very long runs of below threshold data. With a conventional fax system having a line length of 1728 pixels (the standard for letter-size pages), the symbol field represents runs of any length between 1 and 1728. Because the line width was conventionally only 1728, and the EOL character enforced that limit, a larger symbol field was not required.

In one embodiment of a video transmission system incorporating aspects of the present invention, a much shorter possible line width—normally 320 pixels—may be used. Even so, runs as long as the entire image (i.e., width·height), are possible if there is no change in the entire image. For an image of 320 pixels width and 240 pixels height, the run length reaches 76,800. Encoding conventionally using a Huffman encoding scheme would require a huge possible symbol space. One method that can be used to reduce the required symbol space include limiting the maximum length of runs to some value, say MAX_LENGTH (e.g., 60 pixels). In this case, a total run length longer than MAX_LENGTH is encoded by the symbol representing MAX_LENGTH followed by one or more additional symbols, the sum of the lengths represented by those additional symbols equaling the balance of the total run length.

A pseudo-code fragment implementing such an approach is:

---

For (I = currentRunLength; I > MAX_LENGTH; I -= MAX_LENGTH)
[
    EncodeSymbol(MAX_LENGTH)
];
Encode Remaining Residual.

---

Using the above with long runs still consumes more bandwidth than desirable. Therefore, according to one embodiment of the present invention, a digit encoding method is provided that further reduces the required bandwidth.

Digit-Based Encoding

Digit-based encoding is a technique of encoding a value as a sequence of digits, of any numerical base, using symbols that represent those digits.

According to one embodiment of the present invention, long runs are encoded using the most common symbols in use. Long runs are defined as any run for which digit-based encoding is more efficient than conventional encoding as described below. The most frequently-occurring symbols are calculated ahead of time. It does not matter which 10 symbols are used, however, preferably they are the most frequently-occurring. The most frequently-occurring symbols have the shortest bit length which is why they are preferred. In a typical implementation, the most frequently-occurring symbols usually include the lower length run values and the smallest change values for the pixels.

Figure 6:
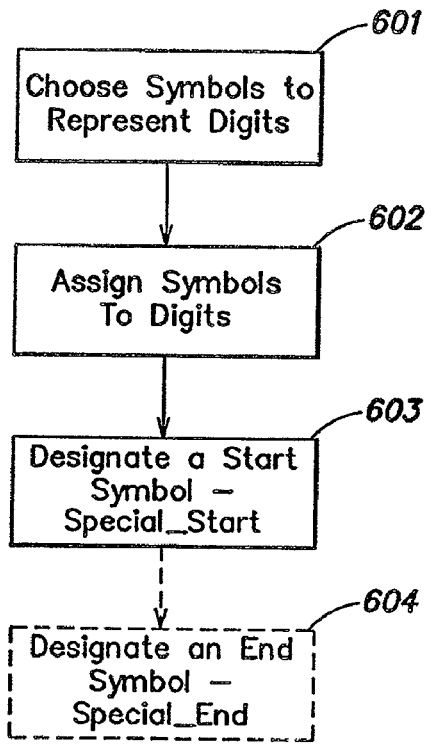
FIG. 6 is a flow chart, showing a method of setting up a digit encoding process according to one embodiment of the present invention.

According to one embodiment of the present invention, the process is set up as shown in FIG. 6 and as described below:

Choose symbols from among the most frequently occurring symbols to represent all 10 digits (step 601). They preferably are the 10 most frequently occurring symbols because frequently occurring symbols are the shortest symbols according to commonly used encoding methods.

Assign a digit from 0 to 9 to each symbol (step 602); each symbol then represents the digit when used as a symbol, as explained below. A sequence of symbols can then represent any length, similar to writing human-readable numbers as sequences of symbols, e.g. the Arabic digits 0 through 9.

Designate a special symbol (step 603), to represent the start of a long symbolic digital sequence.

If desired, designate a special symbol to represent the end of a long symbolic digital sequence (step 604). This can be the same as the start symbol. In one embodiment, the same symbol is used. Alternatively, the special symbol representing the start can include a part that encodes the length of the symbolic digital sequence, so that the number of symbols to interpret symbolically is known ahead of decoding them. However, this start symbol need not indicate the number of digits encoded in the symbol stream, as the end of the symbol stream may be determined by using the same start symbol or a special end symbol (e.g., SPECIAL_END).

Figure 7:
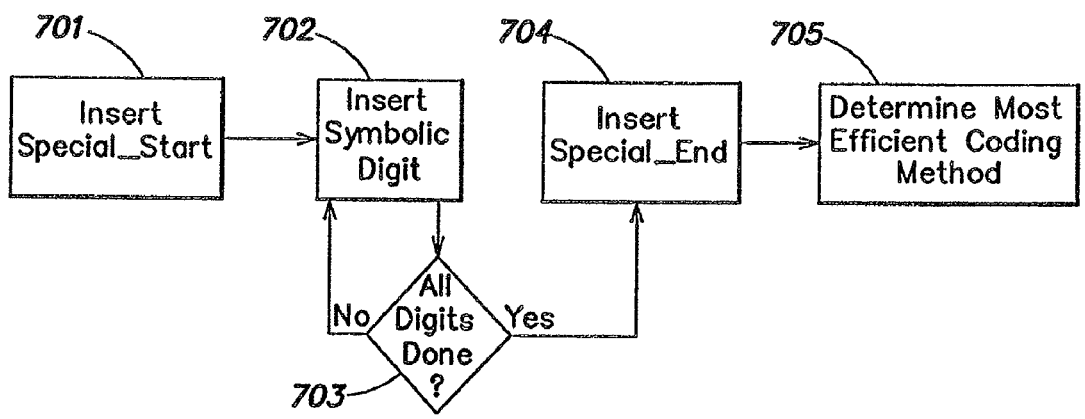
FIG. 7 is a flow chart showing a method of digit-based encoding according to one embodiment of the present invention.

To encode a long run, as shown in FIG. 7, perform the following:

Insert the start symbol (SPECIAL_START) (step 701).

Insert a symbolic digit symbol (SYMBOLIC_0, SYMBOLIC_1, SYMBOLIC_9) for each digit in the number representing the length of the run (steps 702, 703).

If the end symbol (SPECIAL_END) is in use, terminate the run with the end symbol (step 704).

For example, a run of length 415 is encoded as the sequence: SPECIAL_START SYMBOLIC_4 SYMBOLIC_1 SYMBOLIC_5 SPECIAL_END.

Alternatively, the data stream may be encoded in an opposite order. That is, instead of writing the digits in reading order of most significant to least significant, they can be written in least significant to most significant order, and the decoding computer or other receiver may automatically calculate a base multiplier based on the number of digits read. So, in the example above, 415 would be encoded as the sequence: SPECIAL_START SYMBOLIC_5 SYMBOLIC_1 SYMBOLIC_4 SPECIAL_END.

Another alternative that may be used includes encoding from most significant to the least significant bit, but the decoder reads all symbols until the decoder detects the SPECIAL_END symbol, after which the decoder determines the number by a summation (e.g., 100×4+10×1+1×4=415). However, it is noted that the decoding operation is less efficient, as the decoding operation requires two passes over the data.

Deciding when to use digit based encoding is important. Digit based encoding could be used for every run, but that would be wasteful because the digit-based encoding method introduces extra SYMBOL_START and SYMBOL_END symbols. Therefore, digit-based encoding should be used when the number of bits required for representing a run as a symbolic digital sequence is less than the number of bits required to encode the run conventionally. Hence, the process of FIG. 7 may conclude with a determination of the most efficient encoding method (step 705). The most efficient method may be then selected to provide the encoded run.

Figure 8:
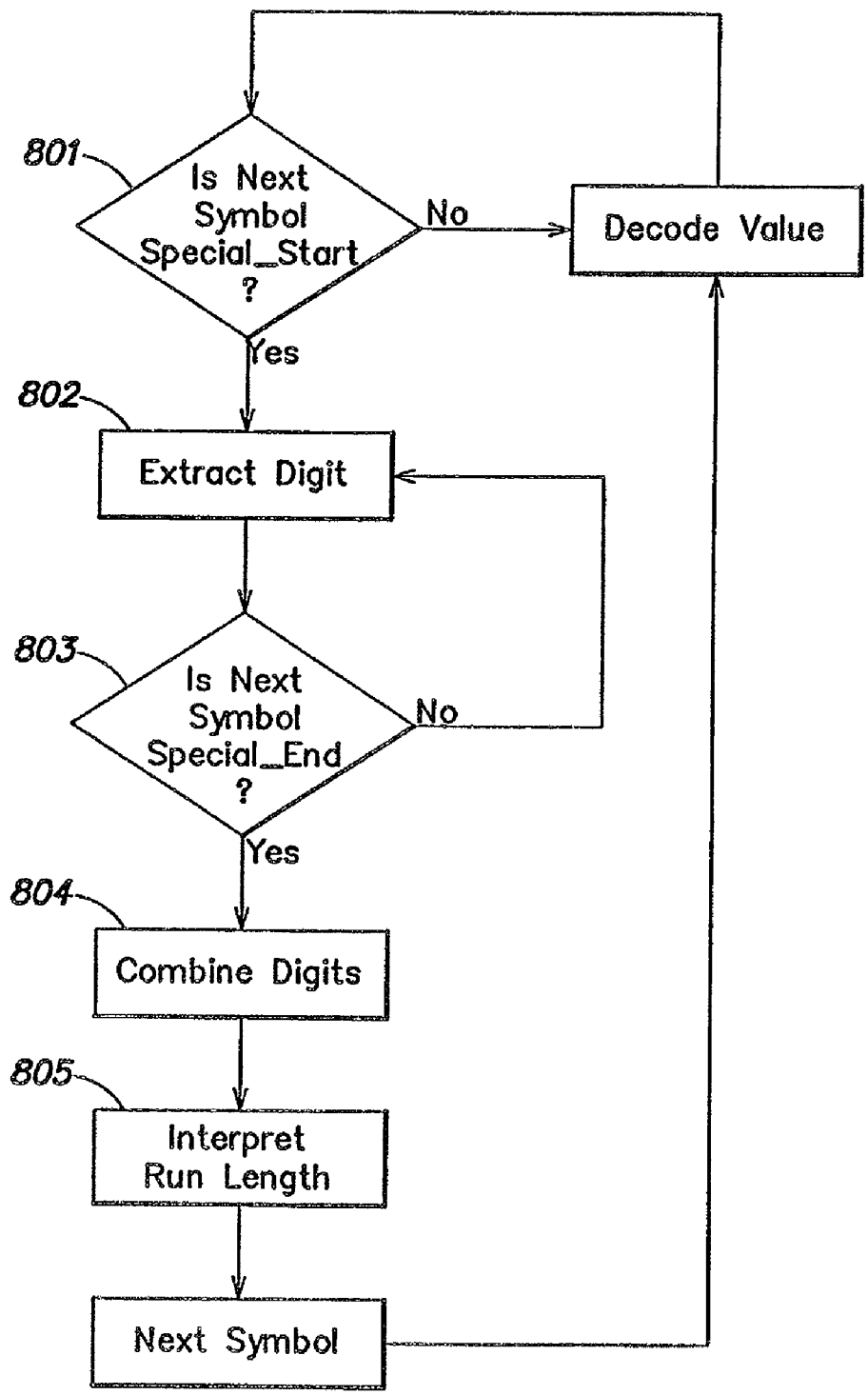
FIG. 8 is a flow chart of a digit-based decoder according to one embodiment of the present invention.

Decoding a stream encoded with digit-based encoding is straightforward. As shown in FIG. 8, when a SPECIAL_START symbol is encountered, the decoder enters digit based mode (step 801). The decoder then enters a loop (steps 802, 803) to extract each digit until the decoder encounters a SPECIAL_END symbol (or until the number of digits indicated by the SPECIAL_START symbol have been decoded). The digits are then combined to form the original number (step 804). The original number is then interpreted as the length of the run (step 805).

Also, as will be understood from the above, this example is given using a base-10 encoding scheme. Other bases, such as octal (base-8) or hexadecimal (base-16) can also be used. If, for example, hexadecimal is used, then the 16 most common symbols are chosen. There is a trade-off between the encoding method to be used and the optimum base for symbolic representation. The skilled artisan may chose amongst the available coding to meet different performance requirements.

The following numerical example is provided to illustrate the foregoing.

In a practical system, 60 is selected as the maximum run for a total symbol space that is limited to 256 symbols. That is, only 256 possible Huffman symbols are available. The choice of 60 as the maximum allowable run length is based on 60 being a sub-multiple of the width of video usually used. The invention is not limited to 60, but rather a maximum number is simply chosen. The larger the maximum number, the more inefficient the code becomes. However, if the maximum number is too small, SPECIAL_START and SPECIAL_END symbols appear in the stream more often which can increase the bandwidth required to transmit the stream.

Assume for the following example that the maximum run length permitted is 20. When a run of 21 is encountered, the run can be encoded as follows:

Assuming: Symbol_Jump=3 bits, Symbol_2=3 bits, Symbol_1=4 bits, Symbol_Run21=5 bits, Symbol_Run1=4 bits, Symbol_Run10=6 bits, and Symbol_Run11=6 bits.

(1). Using digit based encoding, the sequence is: Symbol_Jump Symbol_2 Symbol_1 Symbol_Jump. (Total Length=13 bits)

(2). Using conventional encoding, the sequence is: Symbol_Run20 Symbol_Run1. (Total Length=9 bits)

(3). Using an alternative conventional encoding, the sequence is: Symbol_Run10 Symbol_Run11. (Total Length=12 bits)

As is now apparent, there are many different possible ways to encode a run of 21. The digit-based encoding method may be used when very large runs are encountered and it would be inefficient to encode the run using a conventional method such as in (2) or (3) above, wherein conventional encoding symbols are concatenated together in the data stream.

In the example above, the most efficient encoding method is option (2), given the bit lengths of the symbols listed, however, if the run were 1,122 pixels long, digit based encoding might be a better choice because option (2) would then require 1122/20=56 symbols representing a run of 20, plus one symbol representing a run of 2. That is, 56 repeats of Symbol_Run20 would appear in the data stream, followed by one Symbol_Run2. This representation required 283 bits (given the current symbol assignments).

Using digit based encoding, the same 1,122 pixel run is encoded as SPECIAL-STRT/END, SYMBOLIC_1, SYMBOLIC 1, SYMBOLIC 2, SYMBOLIC 2, SPECIAL_START/END. This representation requires only 20 bits (given the current symbol assignments). When the encoder encodes a run, the encoder uses the method which uses the fewest bits. The encoder can do this because the encoder has information defining how many bits each symbol takes and the encoder performs the method using the fewest bits after computing the bit lengths required by each method.

All three methods above are valid encoding methods for the information. Digit-based encoding can represent any length run very simply.

Anchor Frame Encoding

To further reduce the bandwidth required by systems using embodiments of aspects of the invention, as now described in connection with FIG. 9, intra frames and inter frames (also referred to as difference frames) are supplemented with anchor frames. Using anchor frames as now described results in a more robust data stream while using less bandwidth.

Anchor frames are first described in a system wherein they are combined with conventional intra and inter frames.

As previously explained, a conventional system using difference frames to transmit a series of source frames to a decoder first encodes and transmits an intra frame, i.e., a key frame, containing all of the information required to decode the frame image. The conventional system then encodes and transmits a series of inter frames, i.e., difference frames, each of which contains information representing the incremental differences between the current source frame or decoded frame and the immediately preceding source frame or decoded frame. Whenever desired, any frame can be designated an anchor frame (referred to hereinafter as a "T" frame), from which difference computations of succeeding difference frames can be made.

To determine when to designate frames as T frames, both the encoder and the decoder must possess information indicating whether the decoder has successfully received and decoded a recent frame. Then, that recent frame can be designated a T frame. In the case of decoding an inter frame, success ordinarily requires that the most recent intra frame and all the intervening inter frames be correctly decoded. Of course, other success criteria can be employed, but this criteria is one which ensures that when a T frame is designated, it represents an accurate version of the frame it corresponds to.

The normal transmission mode can be T frame transmission mode, or T frames can be used as an alternate mode of transmission.

For example, in one embodiment, T frame encoding may be used for the first frame after a loss has been reported by the decoder to the encoder. This mode of transmission, if used alternately with inter frame and intra frame transmission modes, effectively replaces sending the intra data when a loss occurs. In the second frame after a loss, inter data is transmitted.

In another example, the encoder could periodically send T frame data if the network connection is quite bad. This can be determined by arranging a feedback communication path from the decoder back to the encoder to report on the network connection condition, or by any other suitable means.

Two fundamental differences between T frames and intra frames are that (1) the encoder receives information that indicates with certainty that the decoder has received a particular T frame, and (2) the decoder has stored it without subsequent modification. In theory, the length between intra frame transmissions can be lengthened by using T frame data.

In one exemplary embodiment of the present invention, the encoder sends T frame data at either arbitrary or regular intervals, even when there is no loss so that the time interval over which the entire image would normally be refreshed with intra data, e.g., 300 frames, may be extended. In this example, the T frame serves the function of assuring the decoder that correct data is still being decoded when the T frame is designated, so a complete refresh of the image is not required as frequently. This example applies to systems which segregate all intra frame data into individual frames and all inter frame data into separate frames, as well as to.

In another example, T frames are only encoded when there is loss. In systems which segregate all intra frame data into individual frames and all inter frame data into separate frames, designating T frames is of no consequence because a complete intra frame is sent following the loss, anyway. However, in systems which interleave intra frame data within the inter frames, for example at a rate of 10 lines of intra frame data per inter frame, the next inter frame after a loss, which includes 10 lines of regularly scheduled intra frame data and also will include, say, 10 lines of intra data covering the loss, in this example, can be designated as a T frame. By designating T frames in this way, recovery from losses can be simplified and bandwidth reduced.

Figure 9:
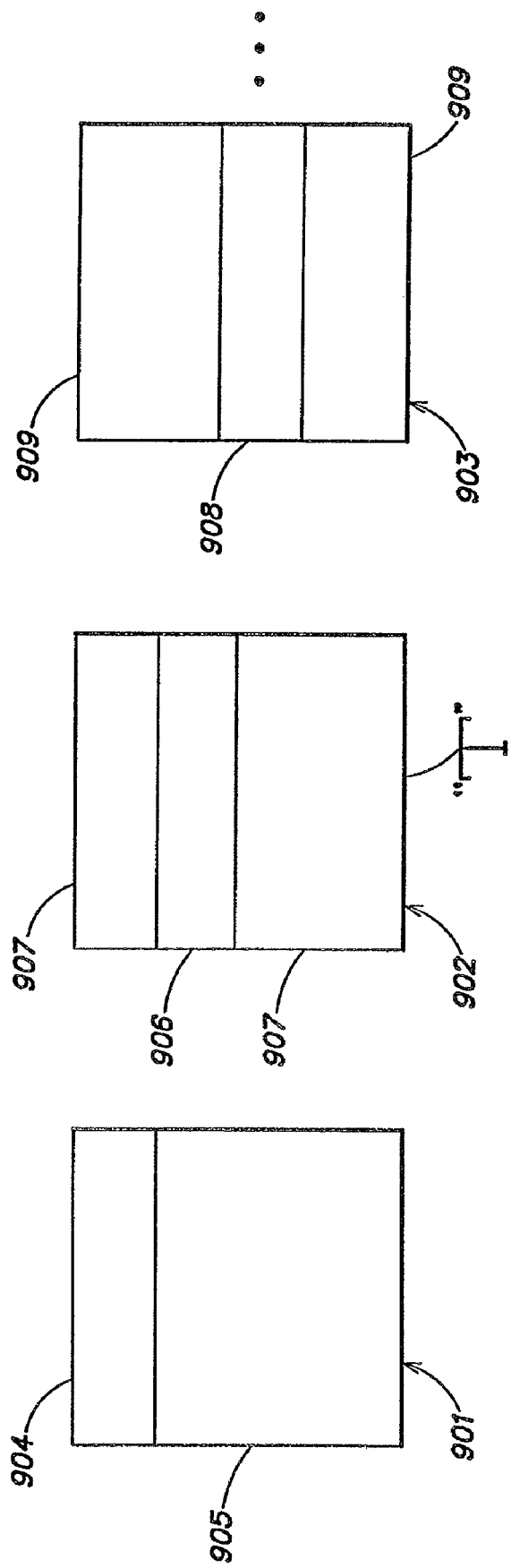
FIG. 9 shows a frame stream including "T" frames according to one embodiment of the present invention.

FIG. 9 shows a frame sequence including a T frame. The frame sequence is structured as follows.

The first three frames 901, 902 and 903, of a sequence are shown. Frame 901 comprises an intra portion 904 and an inter portion 905. That is, lines within the region 904 are represented by the actual values of the pixel parameters represented, such as intensity, while lines within the region 905 are represented by differences between the values of the pixel parameters of a previous T frame received and designated by mutual agreement between the decoder and encoder, and the values of the pixel parameters to which the decoder should decode the present frame (901).

Frame 902 also comprises an intra portion 906 and an inter portion 907. Assume that the decoder has determined that frame 902 has been successfully received, and that information communicated back to the encoder. The frame may then be designated a T frame, as indicated. The designation must be communicated between the decoder and the encoder, so that both the decoder and the encoder have the information that differences are to be measured, going forward in the sequence of frames, from this T frame. In the illustration, intra portion 906 does not overlap with the intra portion 904 of frame 901. However, if frame 902 has been designated a T frame for the additional reason described above, i.e. that frame 901 has been lost, then region 906 would at least overlap completely the lost intra information 904.

The third frame in this sequence, frame 903, also includes an intra portion 908 and an inter portion 909. As with frame 902, intra portion 908 does not overlap with previous intra portions 904 or 906. The portion of each succeeding frame refreshed by an intra portion will continue to vary until the entire frame has been refreshed, at which point the intra portion will appear at the location of intra portion 904 again. The differences contained in inter portion 909 relate back to the most recent T frame 902, which is the most recent frame confirmed by both the decoder and encoder to have been correctly received.

The sequence of frames may include more T frames or fewer T frames, depending on the quality of the connection determined by the communication between the decoder and the encoder. If the connection is of poor quality, T frames can be designated more frequently, so as to prevent degradation of image quality. The designation of T frames can be tied to losses of frames, or can be scheduled at intervals dependent on connection quality, or can be scheduled according to some combination of those, or can be scheduled according to any other suitable method.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method of encoding a sequence of frames of image data in a communications network, each frame including a number of lines of pixels equal to a frame height, and each line having a number of pixels equal to a line length, the method comprising acts of:
   encoding, by a host of the communications network, as an encoded symbol stream, a sequence of pixels of a frame without including an end-of-line code after each line;
   identifying, by the host of the communications network, as a run having a run length, a sequence of pixels having values less than a threshold;
   encoding, by the host of the communications network, the run length using digit-based encoding as a sequence of separate digits, using a separate symbol to individually represent each of the separate digits in the sequence; and
   combining, by the host of the communication network, the separate symbols into a sequence of separate symbols identifying the run length.

2. The method of claim 1, wherein encoding the run length further comprises acts of:
   identifying, by the host of the communications network, a set of most frequently used symbols;
   assigning, by the host of the communications network, a symbolic digit to each of the set of most frequently used symbols;
   assigning, by the host of the communications network, a start symbol; and
   encoding using digit encoding includes acts of:
   inserting in the encoded symbol stream, by the host of the communications network, the start symbol; and
   inserting in the encoded symbol stream after the start symbol, by the host of the communications network, a sequence of symbolic digits identifying the run length of the run.

3. The method of claim 2, further comprising acts of:
   assigning, by the host of the communications network, an end symbol; and
   inserting, by the host of the communications network, the end symbol in the encoded symbol stream after the sequence of symbolic digits.

4. The method of claim 2, further comprising an act of:
defining, by the host of the communications network, the assigned start symbol to include a field indicating how many of the symbolic digits are required to identify the run length of the run.

5. A host of a communications network for encoding a sequence of frames of image data, each frame including a number of lines of pixels equal to a frame height, and each line having a number of pixels equal to a line length, the host comprising:
a memory device having stored thereon data representing sequences of computer readable instructions; and
a processor configured to execute the computer readable instructions, wherein the computer readable instructions cause the processor to:
encode as an encoded symbol stream a sequence of pixels of a frame without including an end-of-line code after each line;
identify as a run having a run length, a sequence of pixels having values less than a threshold;
encode the run length using digit-based encoding as a sequence of separate digits, using a separate symbol to individually represent each of the separate digits in the sequence; and
combine the separate symbols into a sequence of separate symbols identifying the run length.

6. The host of claim 5,
wherein the computer readable instructions further cause the processor to:
identify a set of most frequently used symbols;
assign a symbolic digit to each of the set of most frequently used symbols;
assign a start symbol;
insert in the encoded symbol stream the start symbol; and
insert in the encoded symbol stream after the start symbol a sequence of symbolic digits identifying the run length of the run.

7. The host of claim 6,
wherein the computer readable instructions further cause the processor to:
assign an end symbol; and
insert the end symbol in the encoded symbol stream after the sequence of symbolic digits.

8. The host of claim 6, wherein the computer readable instructions further cause the processor to define the assigned start symbol to include a field indicating how many of the symbolic digits are required to identify the run length of the run.

9. A method of decoding a run length of a run in a sequence of frames of image data in a communications network, the method comprising acts of:
receiving, by a host of the communications network, a signal representing a symbol stream;
identifying in the symbol stream, by the host of the communications network, a sequence of combined individual symbols defining the run length encoded using digit-based encoding as a sequence of separate digits, each separate digit individually represented by a separate symbol; and
decoding, by the host of the communications network, the run length as a number represented by the sequence of separate digits.

10. The method of claim 9, wherein identifying further comprises an act of:
recognizing in the symbol stream, by the host of the communications network, a symbol identifying a start of a sequence of digits.

11. The method of claim 10, wherein the act of identifying further comprises an act of:
recognizing in the symbol stream, by the host of the communications network, a symbol identifying an end of the sequence of digits.

12. The method of claim 10, wherein the act of recognizing further comprises an act of:
decoding, by the host of the communications network, the symbol identifying the start to determine a number of digit symbols which follow.

13. A host of a communications network for decoding a run length of a run in a sequence of frames of image data, each frame including a number of lines of pixels equal to a frame height, and each line having a number of pixels equal to a line length, the host comprising:
a memory device having stored thereon data representing sequences of computer readable instructions; and
a processor configured to execute the computer readable instructions, wherein the computer readable instructions cause the processor to:
receive a signal representing a symbol stream;
identify in the symbol stream a sequence of combined individual symbols defining the run length encoded using digit-based encoding as a sequence of separate digits, each separate digit individually represented by a separate symbol; and
decode the run length as a number represented by the sequence of separate digits.

14. The host of claim 13,
wherein the computer readable instructions further cause the processor to recognize in the symbol stream a symbol identifying a start of a sequence of digits.

15. The host of claim 14,
wherein the computer readable instructions further cause the processor to recognize in the symbol stream a symbol identifying an end of the sequence of digits.

16. The host of claim 14,
wherein the computer readable instructions further cause the processor to decode the symbol identifying the start to determine a number of digit symbols which follow.

17. A system for communicating a sequence of frames of image data from a first host to a second host in a communications network, each frame including a number of lines of pixels equal to a frame height, and each line having a number of pixels equal to a line length,
wherein the first host comprises:
a first memory device having stored thereon data representing sequences of computer readable instructions; and
a first processor configured to execute the computer readable instructions stored on the first memory device, wherein the computer readable instructions cause the processor to:
encode as an encoded symbol stream a sequence of pixels of a frame without including an end-of-line code after each line;
identify, as a run having a run length, a sequence of pixels having values less than a threshold;
encode the run length using digit-based encoding as a sequence of separate digits, using a separate symbol to individually represent each of the separate digits in the sequence; and combine the separate symbols into a sequence of separate symbols identifying the run length, and wherein the second host comprises:
- a second memory device having stored thereon data representing sequences of computer readable instructions; and
- a second processor configured to execute the computer readable instructions stored on the second memory device, wherein the computer readable instructions cause the processor to:
  - receive a signal representing a symbol stream;
  - identify in the symbol stream a sequence of combined individual symbols defining the run length encoded using digit-based encoding as a sequence of separate digits, each separate digit individually represented by a separate symbol; and
  - decode the run length as a number represented by the sequence of separate digits.

18. The system of claim 17,
wherein the computer readable instructions stored on the first memory device further cause the first processor to:
- identify a set of most frequently used symbols;
- assign a symbolic digit to each of the set of most frequently used symbols;
- assign a start symbol;
- insert in the encoded symbol stream the start symbol; and
- insert in the encoded symbol stream after the start symbol a sequence of symbolic digits identifying the run length of the run.

19. The system of claim 18,
wherein the computer readable instructions stored on the second memory device further cause the second processor to recognize the start symbol in the symbol stream.

20. The system of claim 19,
wherein the computer readable instructions stored on the first memory device further cause the first processor to:
- assign an end symbol; and
- insert the end symbol in the encoded symbol stream after the sequence of symbolic digits.

21. The system of claim 20,
wherein the computer readable instructions stored on the second memory device further cause the second processor to recognize the end symbol in the symbol stream.

22. The system of claim 21,
wherein the computer readable instructions further cause the first processor to define the assigned start symbol to include a field indicating how many of the symbolic digits are required to identify the run length of the run.

23. The system of claim 22,
wherein the computer readable instructions further cause the second processor to decode the symbol identifying the start to determine a number of digit symbols which follow.

24. An apparatus for encoding a sequence of frames of image data, comprising:
- means for encoding as an encoded symbol stream a sequence of pixels of a frame without including an end-of-line code after each line;
- means for identifying as a run having a run length, a sequence of pixels having values less than a threshold;
- means for encoding the run length using digit-based encoding as a sequence of separate digits, using a separate symbol to individually represent each of the separate digits in the sequence; and
- means for combining the separate symbols into a sequence of separate symbols identifying the run length.

25. An apparatus for decoding a run length of a run in a sequence of frames of image data, comprising:
- means for receiving a signal representing a symbol stream;
- means for identifying in the symbol stream a sequence of combined individual symbols defining the run length encoded using digit-based encoding as a sequence of separate digits, each separate digit individually represented by a symbol; and
- means for decoding the run length as a number represented by the sequence of separate digits.

26. A system for communicating a sequence of frames of image data from a first host to a second host, comprising:
- means for encoding as an encoded symbol stream a sequence of pixels of a frame without including an end-of-line code after each line;
- means for identifying as a run having a run length, a sequence of pixels having values less than a threshold;
- means for encoding the run length using digit-based encoding as a sequence of separate digits, using a separate symbol to individually represent each of the separate digits in the sequence;
- means for combining the separate symbols into a sequence of separate symbols identifying the run length;
- means for receiving a signal representing a symbol stream;
- means for identifying in the symbol stream a sequence of combined individual symbols defining the run length encoded using digit-based encoding as a sequence of separate digits, each separate digit individually represented by a symbol; and
- means for decoding the run length as a number represented by the sequence of separate digits.

* * * * *

UNITED STATES PATENT AND TRADEMARK OFFICE
CERTIFICATE OF CORRECTION

| | | |
|---|---|---|
| PATENT NO. | : 7,634,146 B2 | Page 1 of 1 |
| APPLICATION NO. | : 10/957074 | |
| DATED | : December 15, 2009 | |
| INVENTOR(S) | : Rosenberg | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1200 days.

Signed and Sealed this
Twenty-second Day of November, 2011

David J. Kappos
*Director of the United States Patent and Trademark Office*